United States Patent [19]
Johnson

[11] Patent Number: 5,332,928
[45] Date of Patent: Jul. 26, 1994

[54] BATTERY DRAIN REDUCER

[75] Inventor: William A. Johnson, Minneapolis, Minn.

[73] Assignee: Threepenny Electronics Corporation, Minneapolis, Minn.

[21] Appl. No.: 988,710

[22] Filed: Dec. 10, 1992

[51] Int. Cl.⁵ .......................... G05F 3/08; H04R 25/00
[52] U.S. Cl. ................................ 307/296.6; 307/296.3; 307/272.3; 381/684
[58] Field of Search ......................... 381/68, 68.1, 68.2, 381/68.4; 307/296.6, 296.3, 272.3; 365/227; 302/64, 65, 86; 330/285

[56] References Cited

U.S. PATENT DOCUMENTS

| | | | |
|---|---|---|---|
| 3,867,709 | 2/1975 | Seki et al. | 330/15 |
| 3,920,931 | 11/1975 | Yanick, Jr. | 381/68.2 |
| 3,995,114 | 11/1976 | Marschinke | 330/25 |
| 4,288,831 | 9/1981 | Dolikian | 307/296.3 |
| 4,320,350 | 3/1982 | Drapac | 330/285 |
| 4,366,442 | 12/1982 | Yamada | 330/51 |
| 4,441,086 | 4/1984 | Karlow et al. | 330/297 |
| 4,508,940 | 4/1985 | Steeger | 381/68.4 |
| 4,509,193 | 4/1985 | Carlson | 381/68 |
| 4,528,515 | 7/1985 | Gross | 330/254 |
| 4,636,741 | 1/1987 | Mitzlaff | 330/127 |
| 4,670,720 | 6/1987 | Dijkmans | 330/255 |
| 4,691,381 | 9/1982 | Nakajima | 307/296.3 |
| 4,739,511 | 4/1988 | Hori et al. | 381/68.2 |
| 4,743,833 | 5/1988 | Johnson | 323/224 |
| 4,748,423 | 5/1988 | Jinich | 330/295 |
| 4,759,071 | 7/1988 | Heide | 328/165 |
| 4,764,733 | 8/1988 | Johnson | 330/295 |
| 4,885,798 | 12/1989 | Jinich et al. | 455/52 |
| 4,899,388 | 2/1990 | Mlodzikowski et al. | 381/72 |
| 4,912,393 | 3/1990 | Anderson et al. | 307/296.6 |
| 5,029,005 | 7/1991 | Morris, Jr. | 358/165 |
| 5,107,138 | 4/1992 | Seki et al. | 307/296.3 |
| 5,111,506 | 5/1992 | Charpentier et al. | 381/68.4 |
| 5,131,046 | 7/1992 | Killion et al. | 381/68 |
| 5,170,434 | 12/1992 | Anderson | 381/68 |
| 5,247,581 | 9/1993 | Gurcan | 381/68 |

Primary Examiner—Timothy P. Callahan
Assistant Examiner—Dinh Le
Attorney, Agent, or Firm—Kinney & Lange

[57] ABSTRACT

A current drain reducer for an electronic circuit system such as an electronic amplifier operated through controlling selected circuit branches therein in response to sensing a selected position of a potentiometer used therein. Such circuit branches each has a control conductivity device located therein which has a control therefore connected to a shutdown signal generator which can be a power supply. The potentiometer can have its low terminals in one such circuit branch which may be in a first electronic amplifier circuit and its wiper connected to another such circuit branch which may be in a second electronic amplifier. A sensing circuit for sensing the position of the wiper provides an output signal to the shutdown signal generator.

16 Claims, 8 Drawing Sheets

BATTERY DRAIN REDUCER

BACKGROUND OF THE INVENTION

The present invention relates to circuit arrangements for reducing current drain of batteries and, more particularly, to such arrangements in which the drain reduction is initiated by a potentiometer.

In many electronic circuits the supply of electrical power available is just that of a battery which is subject to a relatively short life if the circuit supplied thereby draws significant current over substantial periods of time. In battery operated equipment, not only is minimizing power dissipation important to lengthen the life of the battery, but this must often be done with circuit arrangements operating from a low voltage.

A typical example of equipment where these conditions exist is hearing aids as shown in electrical schematic diagram form in FIG. 1 having a microphone, 10, a preliminary amplifier, 11, an output amplifier, 12, (shown with a solid line output for a single polarity output signal and with an added dashed line of alternating long and short dashes for a double polarity output signal for which also the speaker ground connection would be eliminated), a speaker or receiver, 13, a battery voltage supply terminal, 14, between which and the ground reference voltage there is a voltage regulator, 15. Voltage regulator 15 is shown providing regulated voltage to microphone 10 and two regulated voltages of different values to preliminary amplifier 11 and output amplifier 12 which also receive battery voltage. Preliminary amplifier 11 and output amplifier 12 have a volume control potentiometer, 16, between them with the mechanically operated wiper ganged (as shown by the dashed line provided using long dashes) to an on/off switch, 17, controlling application of electrical voltage to the hearing aid circuit. A capacitor, 18, prevents constant voltages in either microphone 10 or preliminary amplifier 11 from affecting the other, as does a further capacitor, 19, with respect to output amplifier 12 and volume control 16. Another capacitor shown in dashed lines of short dashes could be used for this purpose between volume control 16 and preliminary amplifier 11.

Such hearing aid devices have been continually reduced in geometrical volume and electrical power drain over the years. Currently, many hearing aids are sufficiently small so as to be housed using in-the-canal packaging to permit the resulting unit to be fitted into human ear canals. Achieving this small a housing for a hearing aid has required microphone 10, speaker or receiver 13, batteries and the electronic circuitry therein to have undergone varied but quite substantial size reductions over those of earlier implementations.

Nevertheless, further reductions in the physical size of these various components of hearing aids are desirable to increase the user's benefits in use thereof. One difficulty with reducing the geometrical volume is the presence of on/off switch 17 shown ganged to volume control 16 in the hearing aid as is very often done since turning down the volume to zero at which point electrical power drain also ceases seems natural, intuitive and convenient to users. Switch contacts from a volume control require a certain spatial volume and are usually made as small as possible, a situation which results in rather small metal parts that are vulnerable to breakage during use. In addition, such small switches are relatively costly to make. Thus, there is a desire to provide circuit arrangements, such as for hearing aids, which can minimize power drain without the use of added small mechanical parts, some of which are moveable, beyond use of an amplitude control, or volume control, potentiometer.

SUMMARY OF THE INVENTION

The present invention provides for reducing or eliminating current drain in an electronic circuit system through controlling selected circuit branches therein in response to sensing a selected position of a potentiometer used therein to operate a shutdown signal generator. Such a signal generator responds by providing a shutdown signal controlling current blocking arrangements in such branches.

DETAILED DESCRIPTION OF THE PREFERRED EMBODIMENTS

Figure 2C:
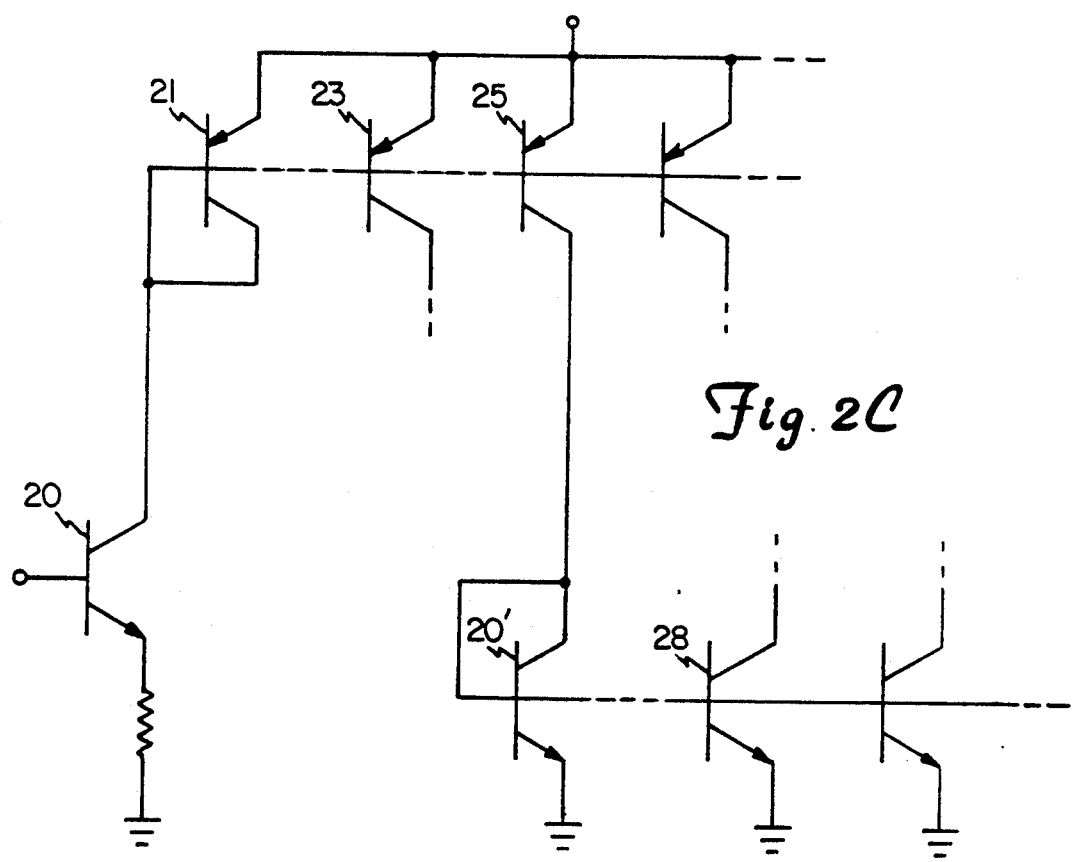

In the design of analog circuits for fabrication in monolithic integrated circuit chips, biasing active devices such as transistors to operate at selected conditions is quite often done in such chips through the use of current sources or current sinks or both. These can be conveniently implemented in monolithic integrated circuits through the use of "current mirror" circuits, or the like, which take advantage of the close "matching" of characteristics of active devices that are fabricated simultaneously in the same chip. Some examples of such biasing arrangements are shown in FIGS. 2A, 2B and 2C.

Figure 2A:
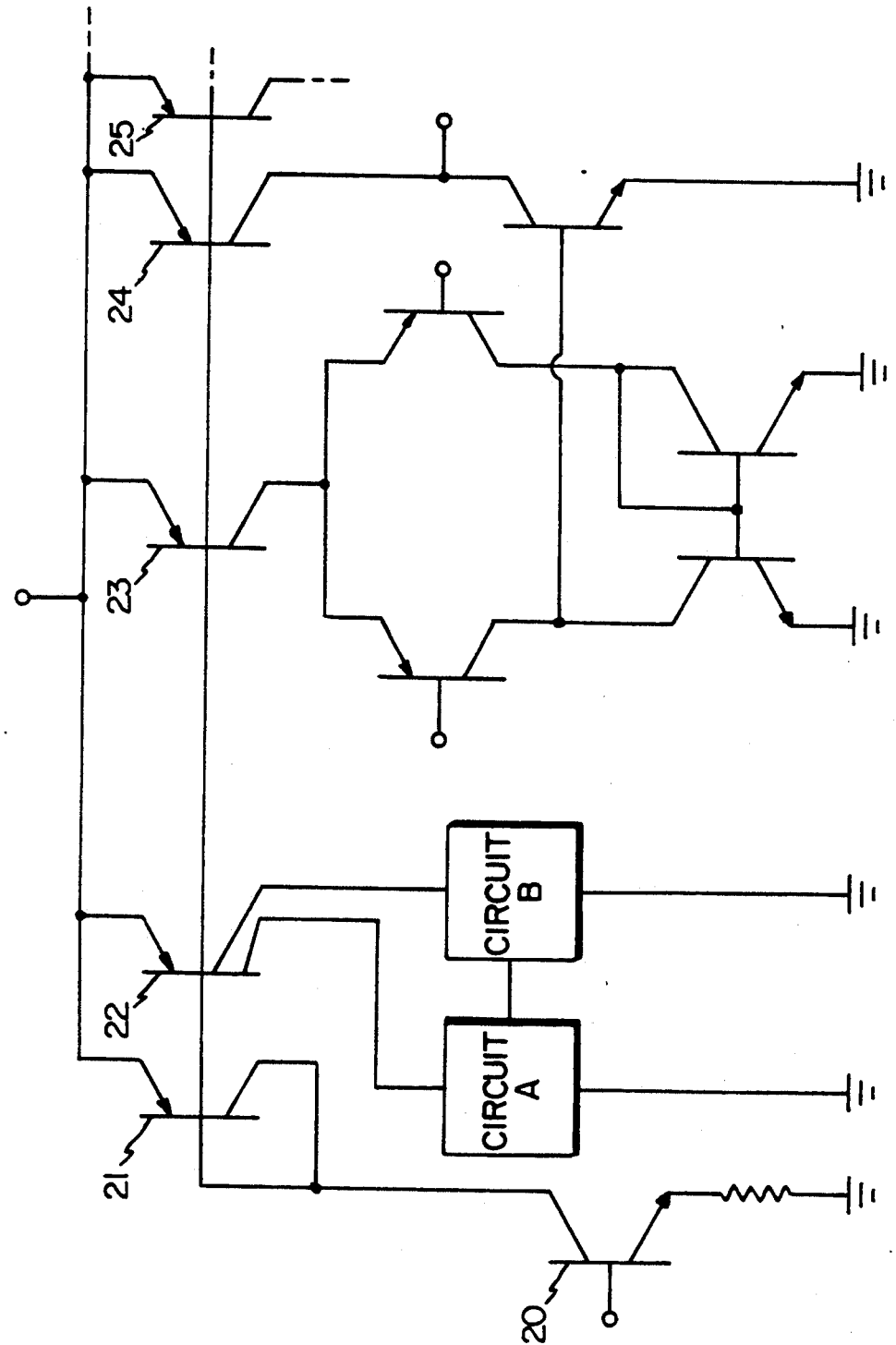
Figure 2B:
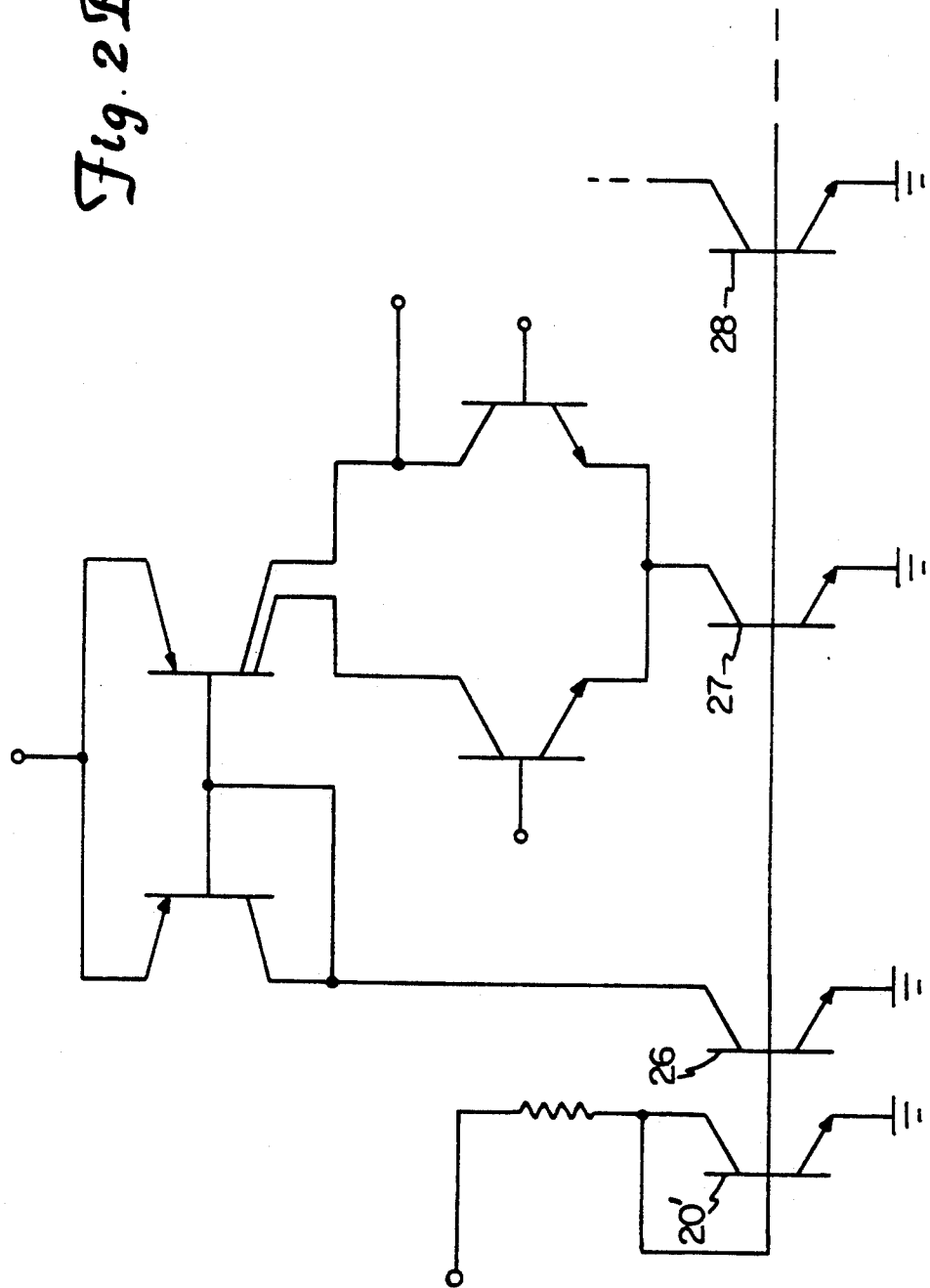

In FIG. 2A, an npn bipolar transistor, 20, serving as an externally controlled transistor, draws a current through a collector thereof set by a control voltage applied to the base thereof and the value of the resistor between the emitter thereof and ground. This collector current is supplied from a pnp bipolar transistor, 21, having its emitter connected to a positive voltage supply terminal at which the voltage that is supplied may or may not be regulated. The base and collector of transistor 21 are connected to the collector of controlled transistor 20. Thus, transistor 21 is a diode-connected transistor.

Several further pnp bipolar transistors, 22, 23, 24 and 25, all have the emitters thereof connected to the same positive power supply terminal as transistor 21, and the bases thereof connected in common to the base of transistor 21 so that they all have the same voltage between the emitter and base thereof. Assuming that they are all fabricated simultaneously in a monolithic integrated circuit chip and of similar dimensions, the currents in each of the collectors thereof will match that in the collector of diode-connected transistor 21 since the base current in each of these pnp transistors will be substantially identical. Thus, the currents in the collectors of transistors 22 through 25 can be said to "mirror" that current in the collector of transistor 21.

Transistor 22 is shown in FIG. 2A as a two-collector transistor with such collectors having matching dimensions and with the emitter thereof matching the dimensions of the emitter of transistor 21. Thus, half the current flowing in the collector of transistor 21 flows in each of the matched collectors. The collectors of transistor 22 supply a couple of circuits, labelled circuit A and circuit B, shown in block form with an interconnection therebetween such that there will be current from each of the collectors of transistor 22 flowing in some circuit branches in each of these blocks.

Transistor 23 is shown as a current source for the emitters of a differential amplifier having a pair of differentially connected pnp bipolar transistors with a corresponding pair of npn bipolar transistors serving as the collector loads therefor, one of such npn transistors being diode-connected. Transistor 24 is shown as the current source collector load for a transistor transforming the signal from the preceding differential amplifier to a single-ended signal. Transistor 25 and the dashed line connections thereafter indicate there can be further pnp bipolar transistor current sources provided under the control of transistor 20.

If the voltage applied to the base of transistor 20 moves with temperature in the same fashion as does the voltage of the base-emitter junction of that transistor, very nearly constant currents can be maintained at the collectors of pnp transistors 21 through 25. Reducing the voltage applied to the base of transistor 20 to zero volts will force it toward the "off" condition preventing current from being maintained in the collector thereof and so in the collector and base of transistor 21. As a result, pnp bipolar transistors 21 through 25 will also be switched into the "off" condition.

FIG. 2B shows an alternative biasing arrangement using npn bipolar transistors in a current "mirror" circuit as current sinks. Here, regulated voltage is applied to a relatively large value resistor connected to both the base and collector of a diode-connected npn bipolar transistor, 20', having its emitter connected to ground. This regulated voltage with a large value resistor extending therefrom form effectively a current source to thus be able to closely control the current passing through the collector and base of transistor 20'. Of course, the current value in transistor 20' can be reduced to substantially zero by reducing the regulated voltage to substantially zero volts.

The currents in the collectors of several other npn bipolar transistors, 26 through 28, again "mirror" the current in the collector of transistor 20' since the bases of each of these latter transistors are connected in common to the base of transistor 20' and the emitters thereof are all connected to ground to give the same base-emitter voltage across each. The current in the collector of transistor 26 is drawn from a diode-connected pnp bipolar transistor having its emitter connected to a positive voltage supply terminal to control the current in a double collector pnp bipolar transistor also having its emitter connected to this terminal. Such control results since the bases of these two pnp transistors are connected in common to one another. This double collector pnp transistor serves as an active device load for a differential amplifier having a pair of differentially connected npn bipolar transistors with the emitters thereof connected to the current sink provided by transistor 27. Transistor 28 and the dashed lines thereafter indicate that additional current sinks can be operated by transistor 20'.

The current sources of FIG. 2A and the current sinks of FIG. 2B can be combined as shown in FIG. 2C to be controlled by the transistor 20 of FIG. 2A through control of the voltage applied to the base thereof That is transistor 20' of the npn transistor current sinks can be operated with a current therethrough controlled by transistor 25 of the current sources. Thus, reducing the voltage at the base of transistor 20 to zero will switch not only transistors 21, 23 and 25 into the "off" condition, but also transistors 20' and 28.

Although other arrangements could be used to replace controlled transistor 20 or diode-connected transistor 20' and the resistors connected therewith to provide current sinks and sources used as controllers, such control transistors conveniently allow control of other source and sinks connected therewith to permit selectively preventing any current flow in those circuit branches in which these others appear. That is, such other current sources and current sinks, under control of transistor 20 or of the voltage source energizing transistor 20', can be directed to eliminate, or greatly increase the impedance in, current paths in those circuit branches in which each is connected in series. This includes circuit branches with plural subordinate branches each having an electrical path therethrough which includes such a current source or a current sink therein, such as the differential amplifier examples in FIGS. 2A and 2B and circuits A and B in FIG. 2A.

Figure 1:
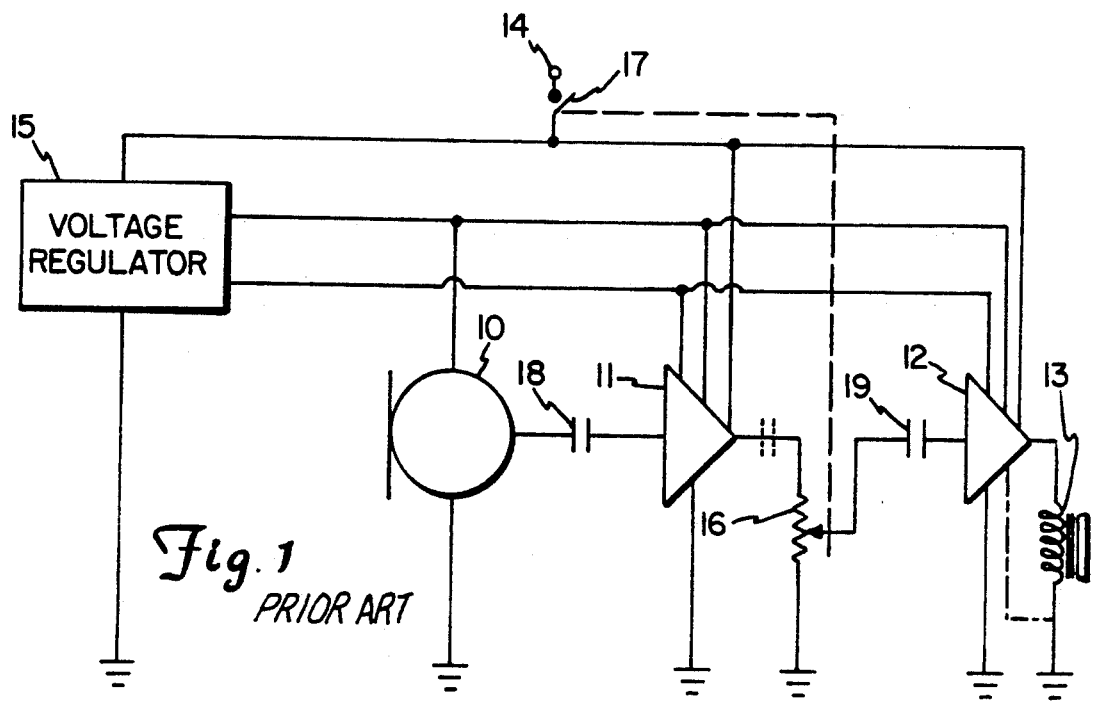
FIG. 1 shows a combined block and electrical schematic diagram of a system for providing an amplified signal to operate an output device, FIGS. 2A, 2B and 2C electrical schematic diagrams of various biasing arrangements for analog circuits such as electronics amplifiers.

Thus, if the circuits in preliminary amplifier 11 and output amplifier 12 of FIG. 1 are constructed of circuit branches each of which has a circuit path therethrough which also passes through a controlled current sink or a controlled current source, or both, the entire current drain through those amplifiers can be essentially stopped. Such a result is accomplished by switching corresponding control transistor 20 into the "off" condition or, depending on the circuit arrangement chosen for the amplifier, reducing to zero the voltage supply for diode-connected transistor 20'. Such an action switches the corresponding transistors connected thereto that are providing current sources or current sinks in the amplifier circuit branches to also being in the "off" condition.

Of course, not every amplifier circuit branch would have to have transistors in series therewith in the "off" condition to still have the above action switching the sources or sinks in those that do to the "off" condition to greatly reduce current drain in either of amplifiers 11 or 12. Such current drains could nevertheless be made very small if such circuit branches not having a transistor therein switched into the "off" condition by the bias control transistors had instead a sufficiently high impedance provided therein such that the current drains through those branches are never very substantial in any situation. Also, there will be very small "leakage" current drains through the current source or current sink transistors in the "off" condition which will be essentially negligible.

Amplifier circuits for amplifiers 11 and 12 in which biasing of active devices, used for the providing of signal amplification etc., is provided through use of such controlled current sources and sinks are known in the prior art. Examples include the amplifier circuits set out in U.S. Pat. Nos. 4,758,798 entitled "Output Amplifier" to Johnson; 4,764,733 entitled "Asymmetrical Dual Input Amplifier" to Johnson; and 4,973,917 entitled "Output Amplifier" to Johnson, all being hereby incorporated herein by reference and made a part hereof. The construction and the operation of the amplifier circuits in these references is described therein, including the description of the control current source connection points and the control regulated voltage connection points for purposes of operating and controlling the current sources and current sinks therein used for biasing the various other active devices therein at suitable device operating points.

The provision of regulated voltage of a selected value to biasing circuits in amplifiers 11 and 12 using such a voltage, such as in the manner of the circuit of FIG. 2B, comes at the upper output voltage terminal on the right side of voltage regulator 15 in FIG. 1. A lower output voltage terminal on that same side of regulator 15 provides a voltage with the temperature compensation necessary for providing a current sink of a stable value of the kind formed by transistor 20 and the resistor connected in its emitter circuit in FIG. 2A. Thus, by choosing a voltage regulator circuit for voltage regulator 15 which can be switched into a zero or very low output voltage condition while thereafter substantially blocking any significant current flow through that voltage regulator, current drain cannot only be substantially reduced or eliminated in the voltage regulator circuit but also substantially reduced or eliminated in both amplifiers 11 and 12 as the voltage at the outputs of the voltage regulator go to zero in response to such switching. That is, circuits, like those shown in FIGS. 2A, 2B and 2C used in the circuitry of amplifiers 11 and 12, having current sources and current sinks therein for biasing other amplifier active devices will have the biasing currents therein forced toward zero as the voltage on the base of each controlled transistor 20 goes toward zero, and as the regulated voltage supplied through a resistor to each diode-connected transistor 20' goes toward zero, with the switching toward zero voltage of the outputs of voltage regulator 15.

Figure 3:
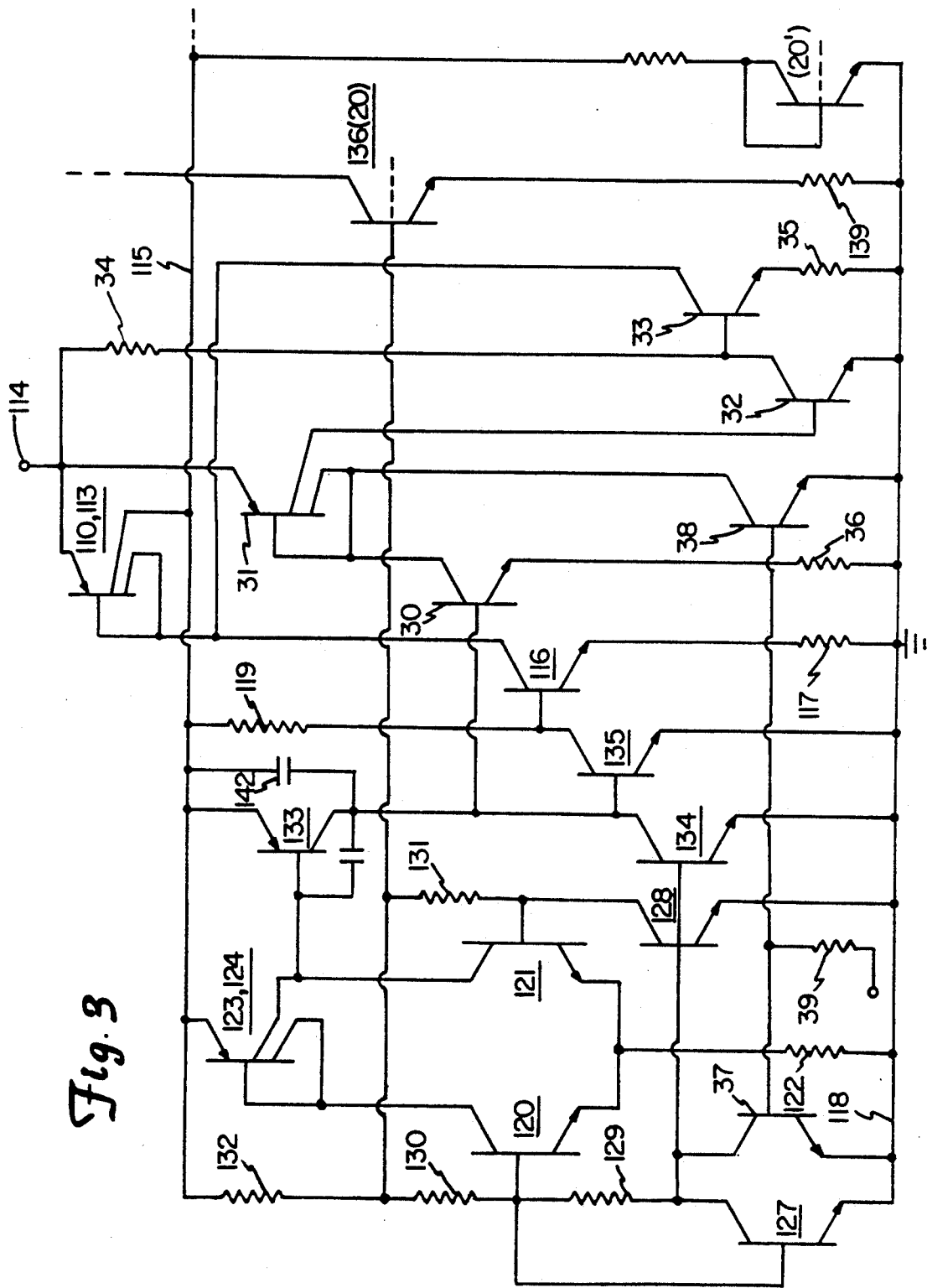
FIG. 3 shows an electrical schematic diagram of a modified voltage regulation arrangement useable in the present invention.

A voltage regulator which is easily modified to have such characteristics for these purposes is known in the prior art and described in U.S. Pat. No. 4,743,833 to Johnson, which is hereby incorporated herein by reference and made a part hereof. That voltage regulator circuit, as modified for the switching purpose described above, is shown in FIG. 3. The components designated with three-digit numbers in FIG. 3 are counterparts to the components found in the circuit described in U.S. Pat. No. 4,743,833 with the last two digits of each of the three-digit designation numbers corresponding to the component numbering used with its counterpart in that patent.

Transistor 136 in FIG. 3 has a designation 20 in parentheses following it to show that it is an example in the position of controlled transistor 20 in FIGS. 2A and 2C with a dashed line extending from the base indicating there may be a plurality of such transistors. Also shown in FIG. 3 is a transistor having the designation 20' in parentheses to indicate that this is an example in the position of the diode-connected transistor 20' shown in FIG. 2B with again a dashed line indication there may be a plurality of such transistors. Thus, the construction and operation of the voltage regulator part of the circuit of FIG. 3 can be understood from the description of the counterparts thereof in U.S. Pat. No. 4,743,833.

In addition in FIG. 3, a regulator "start-up" circuit is provided by the circuit containing an npn bipolar transistor, 30, a diode connected, double collector, pnp bipolar transistor, 31, an npn bipolar transistor, 32, a further npn bipolar transistor, 33, and three resistors, 34, 35 and 36. These circuit components assure that a regulated voltage value appears on regulated voltage output terminal 115 at the initiation of operation of the voltage regulator in FIG. 3. This assurance comes about through a collector current being forced to be drawn by transistor 33 as a result of having its base connected through a current limiting resistor 34, typically of 200 k$\Omega$, to positive voltage supply terminal 114. Such a collector current in resistor 33, also limited by emitter resistor 35 of typically 8 k$\Omega$, must be supplied through transistor 110,113 to thereby assure that positive voltage applied at terminal 114 will also appear in part on regulated voltage terminal 115. As voltage rises on regulated voltage terminal 115 to assure initiation of operation of the regulator circuit, voltage is applied to the base of transistor 30 to cause that transistor to draw a limited base and collector current, limited by emitter resister 36 of typically 16 k$\Omega$, from transistor 31 which in turn provides a current to transistor 32 to thereby switch transistor 33 into the "off" condition so that only a very small current drain through resistor 34 is maintained in the "start-up" circuit.

Further additions to the circuit of FIG. 3 are a pair of npn bipolar transistors, 37 and 38, and a resistor, 39, connected on one end thereof to the bases of both of these transistors. The opposite end of resistor 39 is intended to receive a switching signal to force the regulated voltage on regulated voltage terminal 115 to essentially a zero value and the voltage at the base of transistor 136 also to substantially a zero value, and to direct an accompanying great reduction in the current drain in the regulator circuit shown in FIG. 3. As a result, amplifiers 11 and 12 of FIG. 1, assuming them to be designed with (a) a number of, or all of, the circuit branches therein between terminal 14 and ground having the current paths therethrough also pass through a controlled current source or current sink, or with (b) other branches supplied electrical power from terminal 115, or with (c) other branches having high impedance therein, will also have the electrical current drain therethrough significantly reduced or essentially entirely eliminated as the regulator output voltages approach zero values.

The switching signal to initiate such a result is applied at resistor 39 in the form of a sufficiently large voltage value to cause transistors 37 and 38 to switch into the "on" condition. As a result, transistors 128 and 134 are switched into the "off" condition and the voltage between collector and ground of transistor 127 is forced to essentially zero. The switching of transistor 134 into the "off" condition results in transistor 135 being switched strongly into the "on" condition thereby drawing current through resistor 119 to switch transistor 116 into the "off" condition. This results in drawing a diminishing base current through transistor 110,113 leading that transistor toward the "off" condition and a drop in the voltage value on regulated voltage terminal 115. This drop is reinforced by transistor 128 being forced into the "off" condition leading to drawing a greater base current in transistor 133 by transistor 121 until the collapsing voltage value on regulated voltage terminal 115 declines sufficiently far. Eventually, the voltage on regulated voltage 115 terminal goes to substantially zero.

Similarly, the positive voltage value on resistor 39 switches transistor 38 into the "on" condition which will draw current from the base of transistor 31 to thereby switch transistor 32 into the "on" condition and so transistor 33 into the "off" condition. Thus, transistor 33 will be prevented from attempting to restart the voltage regulator circuit in face of the collapsing of the value of the regulated voltage. Resistor 34, chosen above to have a large resistance value of 200 kΩ, keeps any current drawn through the base of transistor 33 quite small further limited by emitter resistor 35. The current drawn through transistors 37 and 38 will be kept small by choosing a large value of resistance for resistor 39, for instance, 200 kΩ. Resistor 34, also chosen to have a large resistance value of 200 kΩ, keeps any current drawn through the base of transistor 33 during circuit operation or initiation, and the collector of transistor 32 thereafter, quite small which is further limited by emitter resistor 35.

Further, the collapse of the value of the regulated voltage toward zero will rapidly reduce the collector current in transistor 37 toward a zero value resulting in transistor 37 going into saturation where it effectively becomes a diode clamp. The emitter current therethrough can only be that supplied through the base thereof which is kept small, as indicated above, by resistor 39 so that the base-emitter voltage thereof is relatively small. As a result, the voltage on the base of transistor 38 is also relatively small preventing it from conducting unwanted current therethrough from diode-connected transistor 31.

Thus, the positive voltage value applied to resistor 39 will result in forcing the regulated voltage on regulated voltage terminal 115 and the bias voltage applied to the bases of transistors like transistor 136 each to come to be essentially of a zero value. This will result in greatly reducing, or eliminating, the current drain through amplifiers 11 and 12, assuming them to be designed as indicated above. Hence, there is only one further feature required for the arrangement just described to operate like the system of FIG. 1 using therein mechanical on/off switch 17 for controlling current drain through the system. The arrangement described must also have a voltage level change occur at resistor 39 that switches voltage regulator 15' from providing regulated voltage to reducing system current drain on those occasions that the wiper in volume control potentiometer 16 sufficiently approaches that one of the terminals on the ends of the resistor therein that results in the greatest system gain attenuation (the resistor terminal thereof connected to ground in FIG. 1). Those occurrences must be sensed, and the voltage value change applied to resistor 39, by a sensing arrangement controlled by the positional condition of the wiper in volume control 16.

Figure 4:
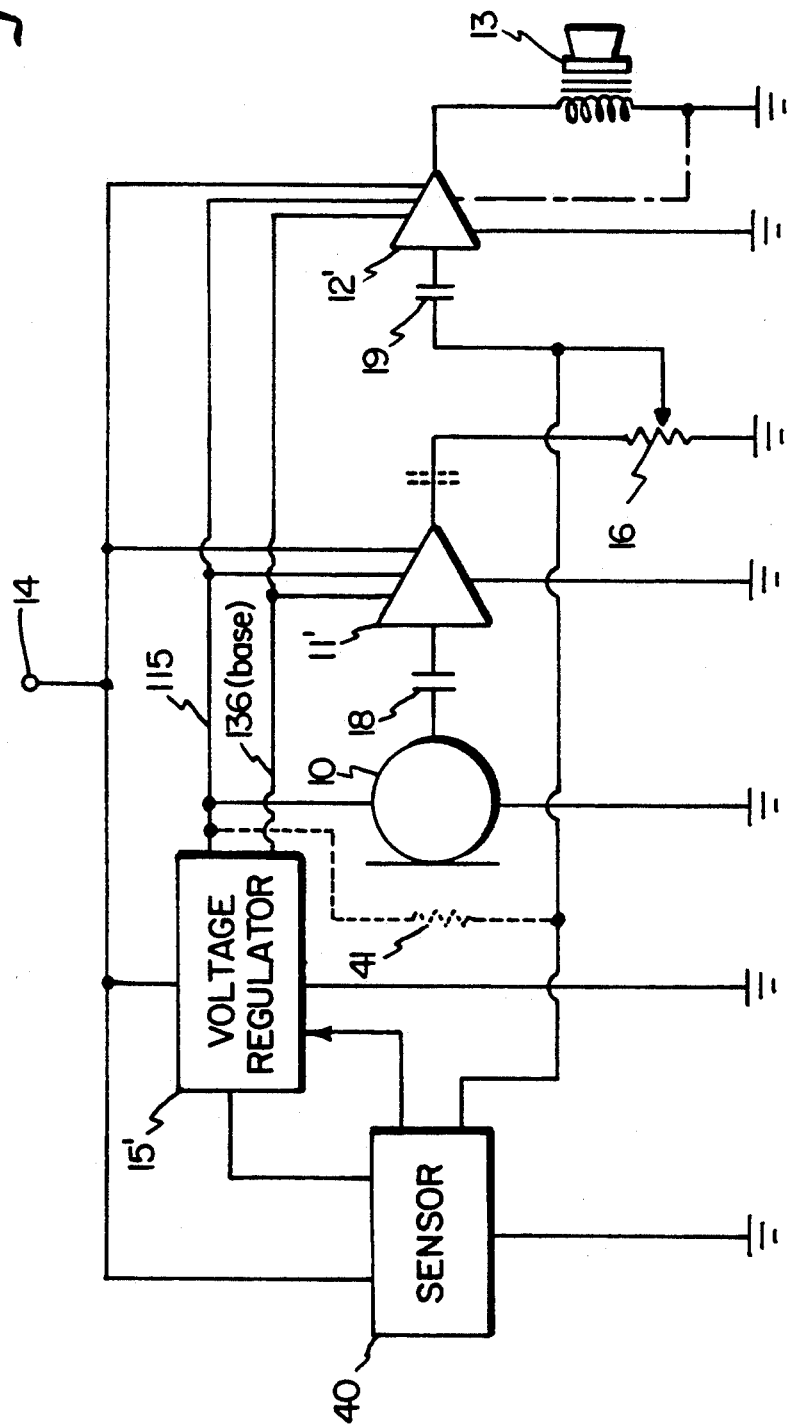
FIG. 4 shows a combined block and electrical schematic diagram of a system embodying the present invention.

The arrangement described above for greatly reducing or eliminating current drain in the voltage regulator, and so in the preliminary amplifier and the output amplifier of the system of FIG. 1, having such a sensor of the volume control wiper position added thereto is shown in FIG. 4. Here, preliminary amplifier 11 of FIG. 1 has been redesignated 11' in FIG. 4 to recognize that (a) at least selected ones of the electrical circuit branches therein, extending between the connection therein to positive supply voltage terminal 14 and the connection therein to ground, have controlled current sources or controlled current sinks, or both, in the various electrical paths therethrough between those connections, or that (b) at least selected ones of the electrical circuit branches therein extend between the connection therein to the regulated voltage terminal 115 and the connection therein to ground. Output amplifier 12 of the system of FIG. 1 has been redesignated 12' in the system of FIG. 4 for the same reason. Voltage regulator 15 of the system of FIG. 1 has been redesignated 15' in the system of FIG. 4 in recognition that it contains a circuit like that shown in FIG. 3 described above. A sensor, 40, is shown operated by voltage supplies from either or both of positive voltage supply terminal 14 and voltage regulator 15' (or the terminal for supplying temperature tracking voltage for transistors like 136(20)). Sensor 40 also senses the position of the wiper in volume control potentiometer 16 through the connection thereto, and is also connected to voltage regulator 15' at resistor 39 by the connection having an arrowhead therewith, as described above.

A comparator can be used for sensor 40 to determine when the voltage between the wiper of volume control potentiometer 16 and ground is sufficiently small indicating that the wiper is near the terminal of the resistor in potentiometer 16 connected to ground. The transition of the comparator output upon such an occurrence can then be used to switch voltage regulator 15' into the condition in which its voltage outputs become essentially zero to thereby also greatly reduce or eliminate the current drains in voltage regulator 15', preliminary amplifier 11' and output amplifier 12'.

Figure 5:
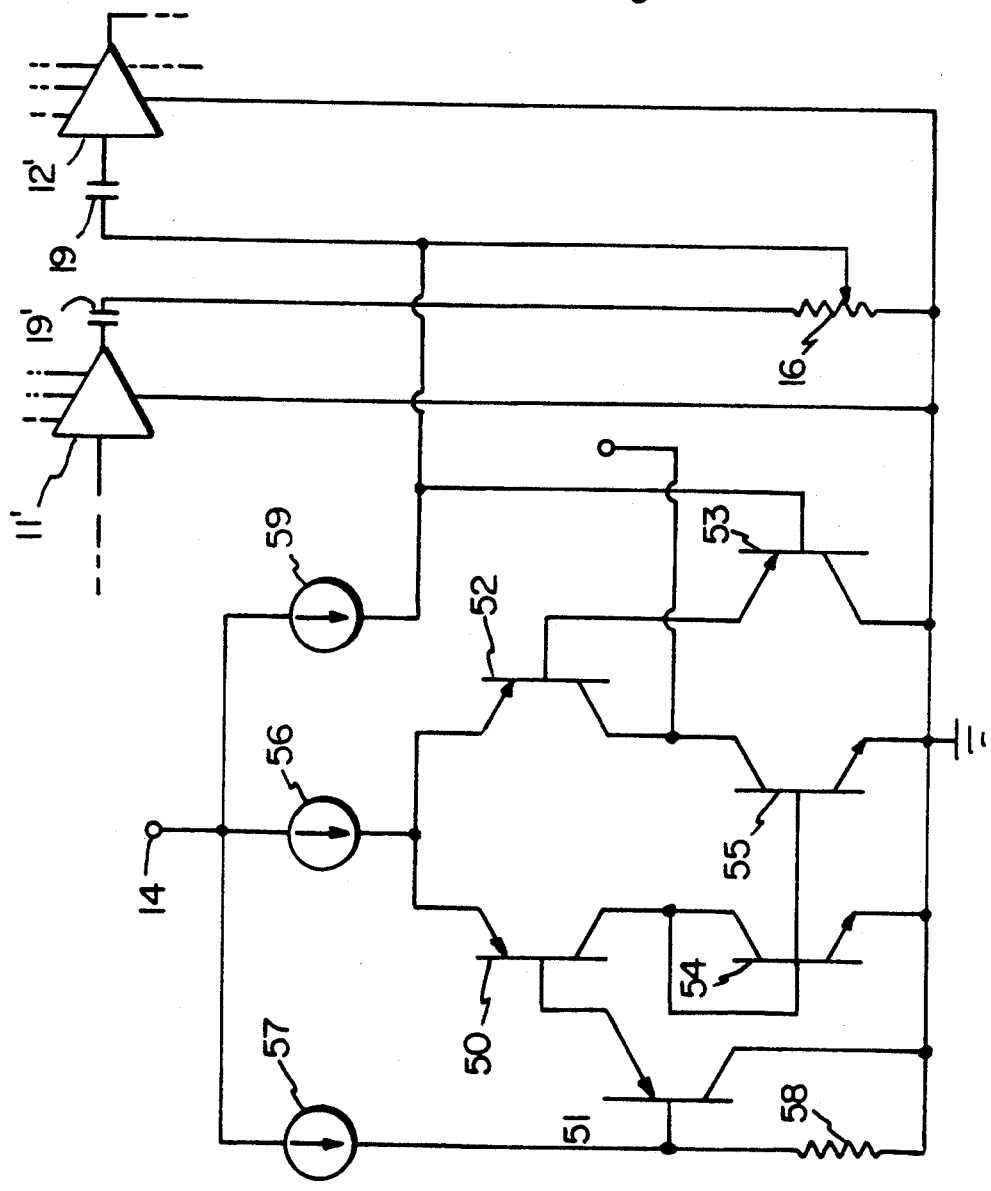
FIG. 5 shows a combined block and electrical schematic diagram useable in the system of FIG. 4.

A possible comparator circuit for sensor 40' is shown in FIG. 5. A first pair of Darlington-connected pnp bipolar transistors, 50 and 51, and a second pair of Darlington-connected pnp bipolar transistors, 52 and 53, form a differential amplifier with the emitters of transistors 50 and 52 connected together in common. These pairs have a pair of corresponding active loads formed by two npn bipolar transistors, 54 and 55, having the bases thereof connected in common, and with one of them having its base also connected to its collector to form a diode. This differential amplifier is supplied current at the emitters of transistors 50 and 52 by a current source, 56, extending thereto from positive voltage supply terminal 14.

A second current source, 57, extending from positive voltage supply terminal 14 determines the voltage value across a resistor, 58, connected between the base of transistor 51 and ground. This voltage value provides the reference level for the comparator.

Volume control potentiometer 16 is isolated from any constant current passing therethrough from output amplifier 12' by capacitor 19, and from preliminary amplifier 11' due to an actual capacitor replacing the dashed line capacitor shown in FIGS. 1 and 4, that capacitor being designated 19' in FIG. 5. Thus. a further current source, 59, provides a current that raises the voltage through a portion of the resistor in potentiometer 16, and so on the wiper of that potentiometer, such that the lowest value voltage occurring in the signal from preliminary amplifier 11' will not cause the wiper to reach ground potential.

Thus, with the differential amplifier of FIG. 5 acting as a comparator in the absence of any feedback therearound, a voltage appearing between the wiper of volume control potentiometer 16 and ground which is greater than that across resistor 58 will lead to transistors 52 and 53 conducting less current transistors 50 and 51 thus allowing transistor 55 to saturate. Thus, the output signal from the comparator (and so sensor 40), taken at the collectors of transistors 52 and 55, will be at or near zero volts leaving transistors 37 and 38 in the "off" condition in the circuit of FIG. 3. On the other hand, if the voltage between the wiper of volume control potentiometer 16 and ground falls to a sufficiently small value, transistors 52 and 53 will conduct more current than transistors 50 and 51. Thus, a positive voltage will appear at the collectors of transistors 52 and 55 that is applied to resistor 39 switching transistors 37 and 38 into the "on" condition. Hence, as the wiper of volume control potentiometer 16 approaches the terminal of the resistor therein connected to ground, the output voltages of voltage regulator 15' will be forced toward zero volts and the current drain in that regulator and in amplifiers 11' and 12' will be greatly reduced or eliminated.

However, in some situations, the operation of this circuit will not be entirely satisfactory. In hearing aid systems, for instance, occurrences of preliminary amplifier 11' going into saturation are inevitable. As a result, a charge can accumulate in the capacitor coupling the output of that amplifier to volume control potentiometer 16. The occurrence shortly thereafter of a sufficiently low value in the signal at the output of amplifier 11' could result in the voltage across the resistor in potentiometer 16 dropping so low that the comparator in the remainder of FIG. 5 will switch even though the wiper of potentiometer 16 has not been moved as close as desired to the terminal of that resistor connected to ground before such switching occurs. The result would be the same as described above leading to a momentary discontinuation of operation of the hearing aid system. One way to avoid this result would be to add a further resistor in series with the resistor of volume control potentiometer 16 which is greater in value than that of the potentiometer resistor to thereby attenuate any such signal. On the other hand, this reduces the gain of the varying signal provided at the output of preliminary amplifier 11'. Thus, an alternative sensing circuit will often be the better choice.

Another reason for turning to an alternative sensing circuit is that output amplifier 12' could also saturate with the result that sharp voltage drops could occur at the input thereto as the feedback used therein momentarily fails to operate the amplifier as desired. Such sharp voltage drops will be coupled through capacitor 19 to the wiper of volume control potentiometer 16 with the possibility of again switching the comparator circuit in FIG. 5 at a time when there is no desire to discontinue operation of the hearing aid system.

Figure 6:
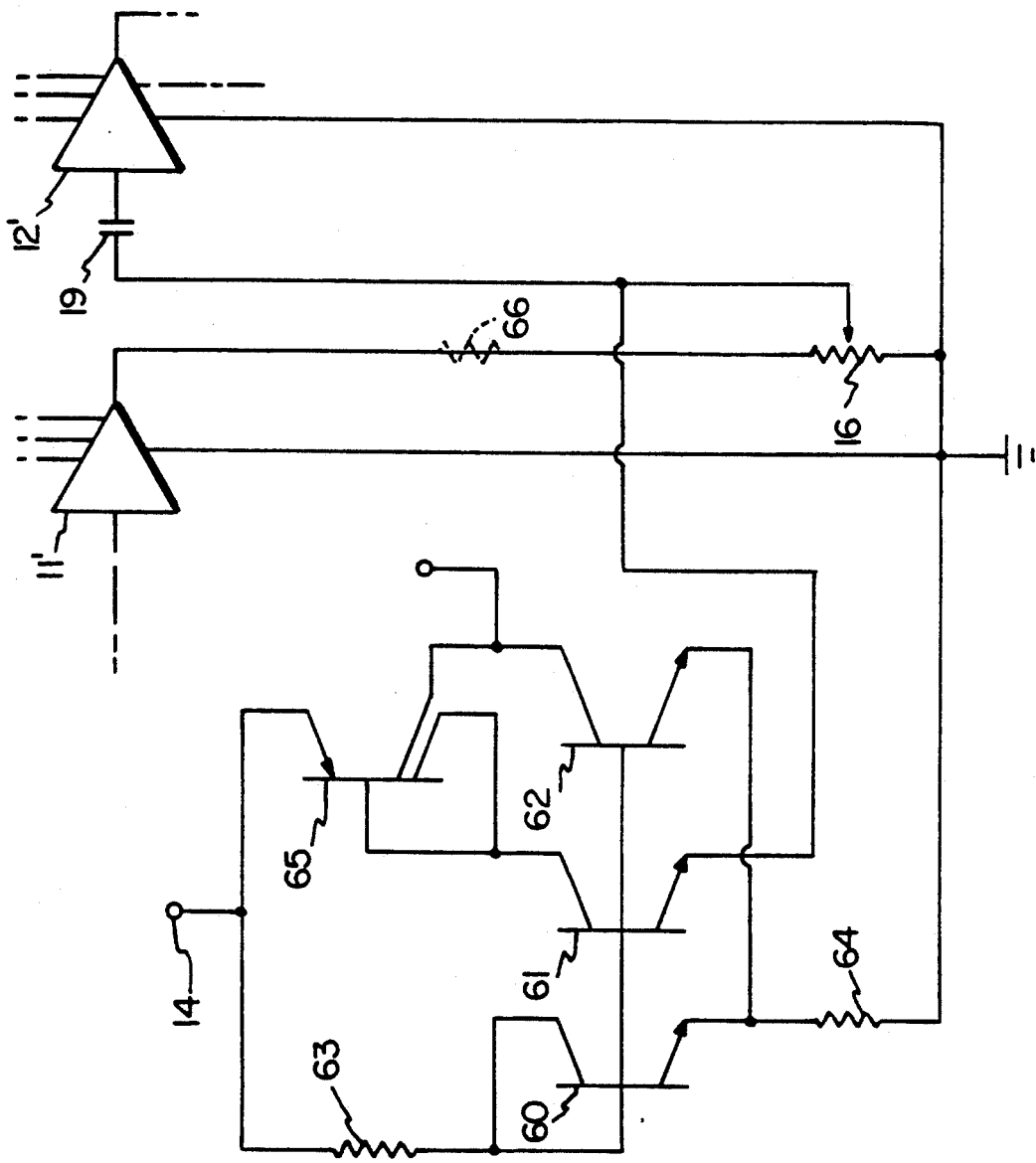
FIG. 6 shows a combined block and electrical schematic diagram useable in the system of FIG. 4.

An alternative comparator arrangement for sensing circuit 40' is shown in FIG. 6. Three npn bipolar transistors, 60, 61 and 62, having their bases connected in common with one another form a comparator which establishes a reference voltage and senses the wiper voltage at an emitter thereof rather than at a base thereof. A pair of resistors, 63 and 64, are used to set the reference voltage at the emitters of transistors 60 and 62. Resistor 63 extends from positive voltage supply terminal 14 to both the base and the collector of transistor 60. Resistor 64 extends from the emitter of transistor 60 and the emitter of transistor 62 to ground. Resistor 63 is a large value resistor, typically 144 kΩ, while resistor 64 is of a relatively small value, typically 225 Ω. Since transistor 60 is diode-connected, these resistors form a fairly stable reference voltage at the emitters of transistors 60 and 62 which can be quite small, in the range of just a few millivolts. Since the bases and emitters of transistors 60 and 62 are connected in common, the reference voltage established on resistor 64 will be approximately the value of that resistance multiplied by twice the current flowing in resistor 63. The voltage need only be large enough to assure that if the emitter of transistor 61 actually went to ground potential, this transistor would conduct more current than would transistor 62.

The collector of transistor 61 is connected to the base and one of the two collectors of a pnp bipolar transistor, 65. The other collector of transistor 65 is connected to the collector of transistor 62 and forms the output of the comparator circuit which is to be connected to resistor 39 in the circuit of FIG. 3. The emitter of transistor 65 is connected to positive supply voltage 14. The emitter of transistor 61 is connected to the wiper of volume control potentiometer 16 to sense the voltage occurring there.

Note that there is no capacitor between the output of preliminary amplifier 11' and the resistor of volume control potentiometer 16. Thus, there is no capacitor to accumulate any net voltage across as a result of amplifier 11' being saturated. On the other hand, preliminary amplifier 11' must then be a single-ended amplifier so that its output voltage, in the absence of an information signal being amplified, forms a bias voltage across the resistor of volume control potentiometer 16. In that arrangement, the output voltage of preliminary amplifier 11' will not be able to drop below ground. Ground potential at the output of preliminary amplifier 11', as will be explained, will not be sufficient to cause switching of voltage regulator 15' to force its regulated output voltage toward ground.

So long as the voltage at the wiper of volume control potentiometer 16 remains above the reference voltage on resistor 64, transistor 61 will conduct less current than will transistor 62 and the voltage at the joined collectors of transistors 62 and 65 will be near zero in value. If, however, the wiper in volume control potentiometer 16 is moved sufficiently close to the end of the resistor therein connected to ground, the voltage at the wiper will drop below the reference voltage across resistor 64 to switch transistor 61 into the "on" condition and cause it to draw more current therethrough than will transistor 62 since the base-emitter voltage across transistor 61 will be greater than that across transistor 62 due to the presence of the reference voltage on resistor 64. As a result, a positive voltage will occur at the output of the comparator circuit capable of switching transistors 37 and 38 of the circuit in FIG. 3 into the "on" condition.

As can be seen, there will be quite low impedance present at the emitter of transistor 61 with the sensing input to the comparator. Not only does the voltage at the emitter of transistor 61 have to drop below the reference voltage across resistor 64, but also a current equal to the current conducted through the emitter of transistor 62 must be drawn through the wiper and a portion of the resistor in volume control potentiometer 16 to ground. Such a requirement to sink several microamps of current reduces the sensitivity of the comparator considerably to spurious trigging due to noise.

This same current requirement makes more unlikely the occurrence of unwanted output changes from this wiper position sensing circuit as a result of the output voltage of preliminary amplifier 11' taking the value of the ground potential. This is an improbable occurrence for most single-ended preliminary amplifier designs using bipolar transistors since the low voltage excursion will often be limited by the saturation voltage of a transistor between the amplifier output and ground. Thus, the preliminary amplifier output signal will be above ground by the transistor saturation voltage which is usually tens of millivolts to a tenth of a volt and so higher than the reference voltage typically provided over resistor 64.

However, there may be some designs for preliminary amplifier 11' which would permit a ground potential on the output thereof such as by using a field-effect transistor instead or by having the load for the bipolar transistor described above being one which can be switched into the "off" condition. In such a situation, the emitter of transistor 61 will be connected to ground through the wiper, through the resistor portion of the volume control potentiometer between the wiper and the output of amplifier 11', and through the amplifier output impedance. Typically, this potentiometer resistance and this amplifier impedance will be sufficient to keep the voltage at the emitter of transistor 61 above that dropped over resistor 64. However, to assure this outcome, a small resistor, 66, shown in dashed line form in FIG. 6, can be added between the output of preliminary amplifier 11' and volume control potentiometer 16 with a resistance value of a few hundred Ohms. Such a resistor will be sufficiently small to have little effect on the magnitude of the audio information signal.

Returning now to FIG. 4, an added resistor, 41, is shown between the regulated voltage output of voltage regulator 15' and the wiper of volume control potentiometer, which can used in connection with the comparator circuit shown in FIG. 6 and so shown in dashed line form. As the wiper of volume control potentiometer 16 is moved toward the ground connection of the resistor therein, the average output voltage of preliminary amplifier 11' is reduced until the regulated voltage of voltage regulator 15' begins to collapse toward zero volts at which point the average output voltage of amplifier 11' also begins to collapse toward zero volts. Hence, this result lowers the voltage at the wiper of potentiometer 16 even more. However, the collapse of the average output voltage of preliminary amplifier 11' may not move directly toward ground as transients therein due to the forcing of the regulated voltage toward zero may cause unpredictable temporary changes in the bias voltage at the output of amplifier 11'. This could result in variation in the voltage at the wiper of potentiometer 16 which might cause unpleasant effects at speaker 13. The addition of resistor 41 adds a bit of hysteresis directly from the regulated voltage which is assured of directly being forced to zero volts. Thus, there will be a sharp transition with a very slight tick of sound that will simply inform the user that the transition has taken place.

The resistance of value of resistor 41 is very large so that only a small current passes therethrough, but this current must be sunk through the wiper of volume control potentiometer 16 in the portion of the resistor therein between the wiper and ground. As the voltage value on regulated output voltage terminal 115 drops toward zero, the current through resistor 41 also drops requiring that additional current be supplied by the emitter of transistor 61 in FIG. 6 which quickens the drop in the voltage value on regulated voltage terminal 115. Hence, positive feedback is introduced to rapidly force the voltage value on the outputs of voltage regulator 15' to quickly go to zero.

Figure 7:
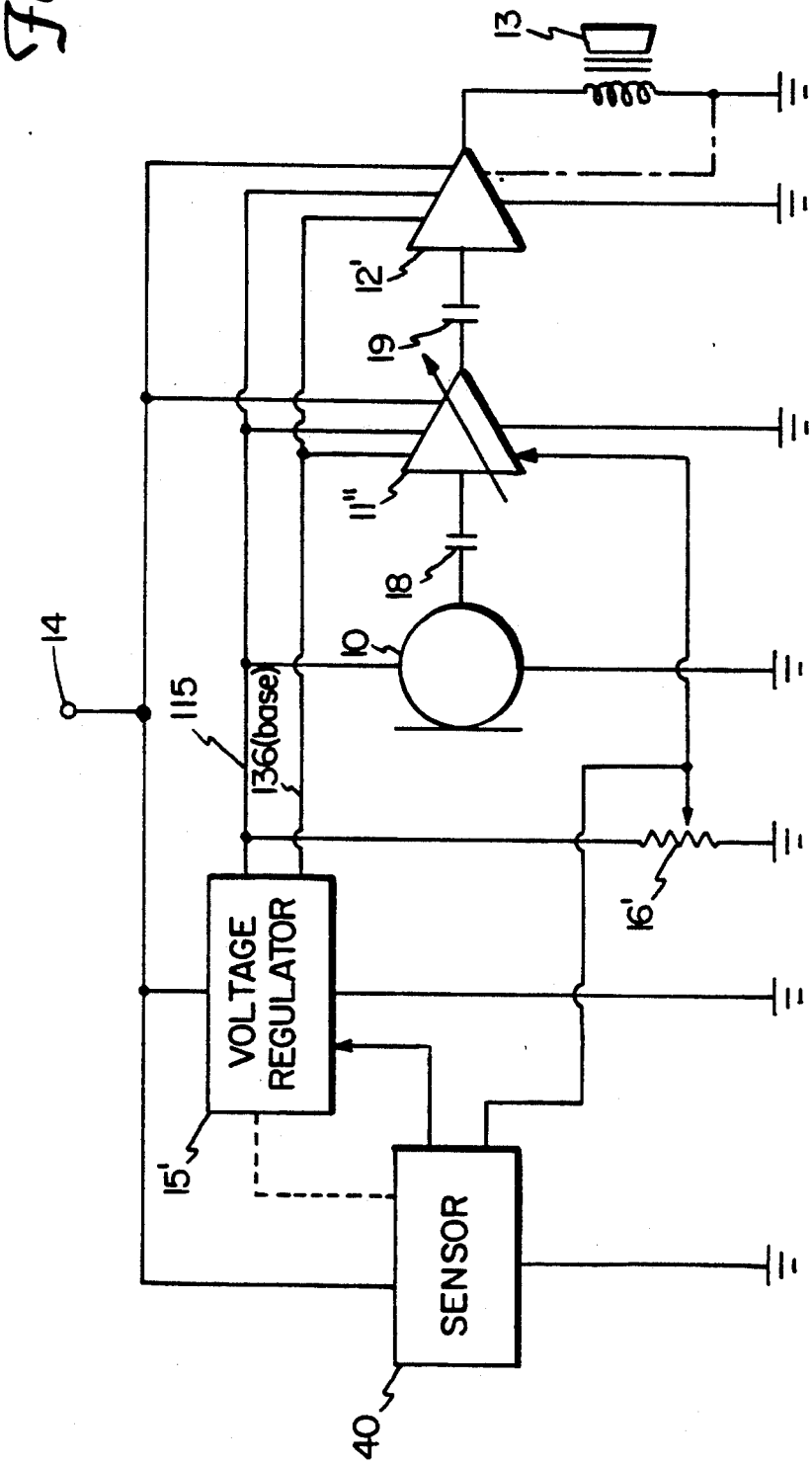
FIG. 7 shows a combined block and electrical schematic diagram of an alternative system embodying the present invention.

In some amplification systems using a volume control potentiometer to control the signal strength at the output of the output amplifier, that volume control potentiometer will not have an information signal passing therethrough as occurs for the preliminary amplifier output signal being passed through volume control potentiometer 16 in FIGS. 1 and 4. Rather, one of the amplifiers in the chain will instead be an adjustable gain amplifier with electronically adjustable gain, typically preliminary input amplifier 11 or 11'. Such an arrangement is shown in FIG. 7 where such a preliminary adjustable gain amplifier has been redesignated 11" to indicate that the gain therethrough is variable and is controlled at a signal input thereto. As a result, the information signal, or audio signal in hearing aid systems, will be transferred directly from microphone 10, through preliminary gain amplifier 11" and then through output amplifier 12' to speaker 13. The gain of adjustable gain amplifier 11" is now controlled by a volume control potentiometer, redesignated as 16' in FIG. 7, and having its resistor terminals connected between regulated voltage terminal 115 and ground. The wiper of gain control potentiometer 16' is connected to the gain control input of adjustable gain preliminary amplifier 11" so that a selected proportion of the voltage dropped across the resistor of gain control potentiometer 16' can be provided to that gain control input.

Although the present invention has been described with reference to preferred embodiments, workers skilled in the art will recognize that changes may be made in form and detail without departing from the spirit and scope of the invention.

What is claimed is:

1. A current drain reducer for reducing current drain in selected electronic circuit systems, said current drain reducer comprising:

a controlled current path system in a said electronic circuit system having first and second power supply connection regions and at least one operation direction region between selected pairs of which a plurality of electrical circuit branches are electrically connected such that selected ones of said electrical circuit branches electrically connected between said first and second power supply regions each include a corresponding one of a plurality of controlled conductivity means electrically connected in series therein at first and second terminating regions thereof, said plurality of controlled conductivity means each having a control region therein, by which it is capable of being directed, through electrical energization thereof, to effectively provide a conductive path of a selected conductivity between its said first and second terminating regions, said plurality of controlled conductivity means each having its control region electrically coupled to a said operation direction region at which a shutdown signal can be provided directing such controlled conductivity means to provide occurrences of relatively low conductivity, and to alternatively provide occurrences of relatively high conductivity, between said first and second terminating regions thereof, said plurality of electrical circuit branches having at least one thereof with a potentiometer means electrically connected in series therewith at end terminals thereof, said potentiometer means effectively having a wiper variably electrically contacting a resistor means electrically connected between said end terminals thereof and having said wiper electrically connected to another of said electrical circuit branches;

a wiper position sensing means having an input electrically connected to said wiper and having an output, said wiper position sensing means being capable of sensing said wiper taking a position sufficiently close to one of said end terminals and of providing an output signal at said output thereof having indicators therein of such occurrences; and a non-mechanical switched shutdown generation means having an input electrically connected to said wiper position sensing means output and having a corresponding output for each said operation direction region with there being an electrical interconnection therebetween, said shutdown signal generation means being capable of receiving said wiper position sensing means output signal and of providing said shutdown signal in correspondence therewith.

2. The apparatus of claim 1 wherein selected ones of said electrical circuit branches, including that one having said potentiometer means electrically connected in series therewith, form a first amplifier having an input and an output, and wherein selected ones of said electrical circuit branches, including that one to which said wiper is electrically connected, form a second amplifier having an input and an output.

3. The apparatus of claim 1 wherein selected ones of said electrical circuit branches, including that one to which said wiper is electrically connected, form a first amplifier having a signal input and a signal output.

4. The apparatus of claim 1 wherein said wiper position sensing means is a comparator means capable of determining whether a signal value at said input thereof has a selected magnitude relationship with a reference value, and is further capable of providing said indicators in said output signal thereof if such a magnitude relationship exists.

5. The apparatus of claim 1 wherein said non-mechanical switched shutdown signal generation means is a controlled voltage regulator having an input at which it can be directed to provide an output voltage at a first said output thereof which is regulated to substantially maintain a first selected value therefor and, alternatively, to provide an output voltage of another value.

6. The apparatus of claim 2 wherein said first and second amplifiers each have at least one active device therein used to amplify magnitudes of information signals provided at said inputs thereof which is electrically connected in series with said first and second terminating regions of a said controlled conductivity means.

7. The apparatus of claim 3 wherein said first amplifier is an adjustable gain amplifier having also a gain control input in said electrical circuit branch to which said wiper is electrically connected and which is electrically connected to said wiper.

8. The apparatus of claim 4 wherein said comparator means comprises a plurality of bipolar transistors each having it base electrically connected in common with one another, and two of them each having its emitter electrically connected to one another and through a resistor to a selected voltage reference with that emitter of another serving as said comparator means input.

9. The apparatus of claim 5 wherein said controlled voltage regulator having an input at which it can be directed to provide an output voltage at a second said output thereof which varies with temperature in a selected manner and, alternatively, to provide an output voltage of another value.

10. The apparatus of claim 7 wherein selected ones of said electrical circuit branches form a second amplifier having a signal input and a signal output, said first and second amplifiers each having at least one active device therein used to amplify magnitudes of information signals provided at said inputs thereof which is electrically connected in series with said first and second terminating regions of a said controlled conductivity means.

11. A current drain reducer for reducing current drain in an electronic amplifier system, said current drain reducer comprising:

a plurality of electronic amplifiers each having an input and an output and electrically connected input of one to output of another in a cascade, said plurality of electronic amplifiers having at least some circuits therein through which magnitudes of electrical current flow depend on magnitudes of externally supplied electrical currents to externally controlled transistors therein, there being a potentiometer means with end terminals and a wiper terminal such that at least one of said end terminals and said wiper terminal are electrically connected to selected ones of said amplifiers;

a wiper position sensing means having an input electrically connected to said wiper terminal and having an output, said wiper position sensing means being capable of sensing said wiper effectively being selected to take a position sufficiently close to one of said potentiometer end terminals and of providing an output signal at said output thereof having indicators therein of such occurrences; and a controllable voltage regulator means suited for electrical connection to a source of electrical power and capable of providing voltages of selected values at output thereof which can be reduced in magnitude in response to signals provided at a control input thereof which is electrically connected to said wiper position sensing means output, said electronic amplifiers being electrically connected to one or more of said voltage regulator means outputs to be supplied electrical currents for operating said amplifiers including supplying electrical currents to said externally controlled transistors, said voltage regulator means being capable of receiving said wiper position sensing means output signal at said control input thereof and changing voltages at one or more outputs thereof to thereby change current flowing through said externally controlled transistors in said electronic amplifiers.

12. The apparatus of claim 11 wherein said wiper position sensing means is a comparator means capable of determining whether a signal value at said input thereof has a selected magnitude relationship with a reference value, and is further capable of providing said indicators in said output signal thereof if such a magnitude relationship exists.

13. The apparatus of claim 11 wherein said potentiometer end terminal electrically connected to one of said amplifiers is electrically connected to an output thereof, and wherein said wiper terminal is electrically connected to an input of that amplifier next in said cascade of amplifiers.

14. The apparatus of claim 11 wherein one of said amplifiers is an adjustable gain amplifier having also a gain control input to which said wiper terminal is electrically connected.

15. The apparatus of claim 11 wherein said controllable voltage regulator means provides an output voltage at one of said outputs thereof which varies with temperature in a selected manner for at least some signal values on said control input thereof.

16. The apparatus of claim 12 wherein said comparator means comprises a plurality of bipolar transistors each having it base electrically connected in common with one another, and two of them each having its emitter electrically connected to one another and through a resistor to a selected voltage reference with that emitter of another serving as said comparator means input.

* * * * *

UNITED STATES PATENT AND TRADEMARK OFFICE
CERTIFICATE OF CORRECTION

PATENT NO. : 5,332,928

DATED : July 26, 1994

INVENTOR(S) : WILLIAM A. JOHNSON

It is certified that error appears in the above-indentified patent and that said Letters Patent is hereby corrected as shown below:

Col. 4, line 14, after "thereof", insert a --.--

Col. 4, line 15, after "is", insert a --,--

Col. 8, line 36, delete "sensor 40'", insert --sensor 40--

Col. 9, line 58, delete "circuit 40'", insert --circuit 40--

Col. 13, line 18, after "shutdown", insert --signal--

Col. 14, line 44, delete "output", insert --outputs--

Signed and Sealed this

Seventeenth Day of January, 1995

Attest:

BRUCE LEHMAN

Attesting Officer     Commissioner of Patents and Trademarks